(12) United States Patent
Myatt et al.

(10) Patent No.: US 6,621,580 B2
(45) Date of Patent: Sep. 16, 2003

(54) SINGLE ETALON WAVELENGTH LOCKER

(75) Inventors: Chris Myatt, Boulder, CO (US); Kurt Vogel, Boulder, CO (US)

(73) Assignee: Precision Photonics Corporation, Boulder, CO (US)

( * ) Notice: Subject to any disclaimer, the term of this patent is extended or adjusted under 35 U.S.C. 154(b) by 0 days.

(21) Appl. No.: 09/971,084

(22) Filed: Oct. 3, 2001

(65) Prior Publication Data

US 2003/0035119 A1 Feb. 20, 2003

Related U.S. Application Data (60) Provisional application No. 60/313,355, filed on Aug. 17, 2001, provisional application No. 60/312,502, filed on Aug. 14, 2001, and provisional application No. 60/289,644, filed on May 8, 2001.

(51) Int. Cl.$^7$ ................................................. G01B 9/02
(52) U.S. Cl. ....................................... 356/519; 356/454
(58) Field of Search ........................... 372/32; 356/519, 356/454

(56) References Cited

U.S. PATENT DOCUMENTS

| | | | |
|---|---|---|---|
| 4,784,490 A | * 11/1988 | Wayne | .................. 356/487 |
| 4,947,398 A | * 8/1990 | Yasuda et al. | .......... 372/29.021 |
| 5,798,859 A | 8/1998 | Colbourne et al. | |
| 6,005,995 A | 12/1999 | Chen et al. | |
| 6,291,813 B1 | 9/2001 | Ackerman et al. | |

OTHER PUBLICATIONS

Tetsuhiko Ikegami; Shoichi Sudo; Yoshihisa Sakai—"Frequency Stabilization of Semiconductor Laser Diodes" 1995 pp. 76–81 and 194–208.

* cited by examiner

Primary Examiner—Samuel A. Turner
Assistant Examiner—Patrick Connolly
(74) Attorney, Agent, or Firm—Robert G. Crouch; Marsh Fischmann & Breyfogle LLP (57) ABSTRACT

A wavelength locker includes a first beam splitter positioned in a beam path of an output beam produced by a laser. The first beam splitter splits the output beam into a first beam and a second beam. An interferometric optical element is optically contacted to the first beam splitter. The interferometric optical element receives the second beam from the first beam splitter and generates a third beam with an optical power that varies periodically with wavelength. A second beam splitter is positioned in a beam path of the first beam or in a beam path of an output beam produced by a laser, and creates a fourth beam. A first detector generates a first signal in proportion to an optical power of the third beam. A second detector generates a second signal in proportion to an optical power of the fourth beam. A wavelength of the output beam is adjusted in response to a comparison of the first and second signals and a predetermined reference signal level.

60 Claims, 12 Drawing Sheets

SINGLE ETALON WAVELENGTH LOCKER

CROSS-REFERENCE TO RELATED APPLICATIONS

This application claims the benefit of U.S. Provisional Application No. 60/312,502, filed Aug. 14, 2001 and U.S. Provisional Application No. 60/313,355, filed Aug. 17, 2001, which are both incorporated herein by reference. This application also claims the benefit of U.S. Provisional Application No. 60/289,644, filed May 8, 2001.

BACKGROUND OF THE INVENTION

1. Field of the Invention

The present invention relates to wavelength lockers, and more particularly to a wavelength locker suitable for use with a tunable laser.

2. Description of the Related Art

Laser frequency monitoring and locking is an essential technology for optical communications and other fields. For instance, optimization of a dense wavelength division multiplexing (DWDM) system requires tight control and accurate tuning of each frequency propagated down an optical fiber by a communication laser. In DWDM, each of a plurality of laser signal sources is tuned in frequency to a distinct channel, allowing a plurality of signals to be simultaneously transmitted down a single optical fiber. In this way, large volumes of information can be transmitted through a single optical fiber. The communication channels are defined on a grid with equal frequency spacing in a band near 194 THz (the ITU grid).

Each laser must be stabilized, or "locked," to a wavelength locker so as to ensure it remains frequency-tuned to the proper communications channel, regardless of environmental or systematic disturbances. A wavelength locker provides a stable and calibrated reference for measuring the wavelength deviation of a laser output from a desired wavelength, such as an ITU communications channel. The signal from the wavelength locker is used to tune the laser wavelength back to the desired communication channel. Mistuning is highly detrimental to the performance of a DWDM system since many DWDM components exhibit wavelength-dependent losses. Wavelength lockers are critical to telecommunication systems because they allow for more closely spaced channels, thus increasing the information bandwidth of a DWDM system.

Figure 1:
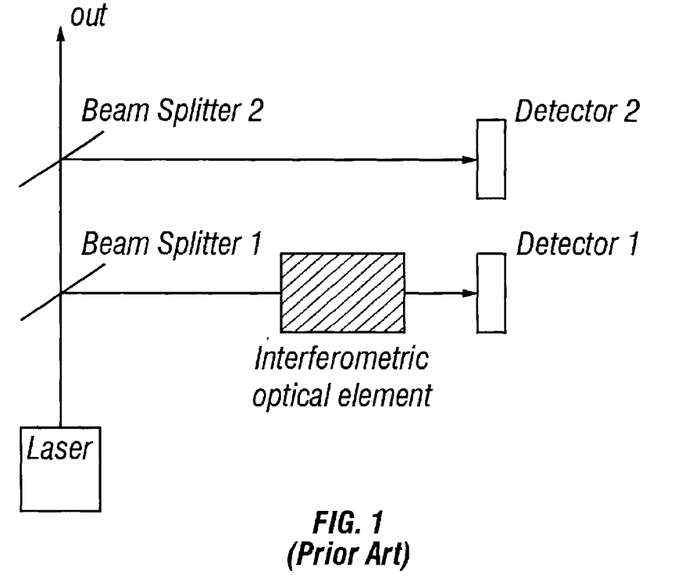
FIG. 1 is a illustration of a prior art wavelength control system.

For DWDM systems where the communications channels are spaced equally apart in optical frequency, it is common to use an interferometric optical element, such as a Fabry-Perot (FP) etalon, as the reference element of a wavelength locker, as shown in FIG. 1. An FP etalon is a simple interferometric device composed of two partially-reflecting mirrors that are substantially parallel and separated by a gap. The transmission of light through an FP etalon is periodic in wavelength and is expressed as an Airy function (Optics, $2^{nd}$ Ed., Hecht, p.367). The separation in frequency between the periodic peaks of the transmission response is called the Free Spectral Range (FSR), and it depends on the optical path length of the gap between the etalon mirrors. The frequency dependence of the transmission response of an etalon can be used as a discriminator for locking the laser optical frequency. A common strategy for wavelength locking is to match the FSR of the etalon to the frequency spacing of the ITU grid. The FP etalon acts as a calibrated reference to indicate where the ITU channels are located.

The wavelength locker also must be insensitive to changes in the input optical power input to FP etalon. For example, a common strategy for frequency locking is to use the side of an etalon transmission peak for frequency discrimination. In this method the output signal from the etalon is compared to a fixed reference value and provides a measure of the deviation of the laser from the lockpoint. However, power fluctuations in the input light are also capable of producing changes in the etalon transmission signal, mimicking a frequency change and unintentionally detuning the laser from the desired lockpoint. To differentiate between a frequency change and a power change of the laser light, a power reference is measured that is independent of the etalon signal. The power reference signal is used to normalize the etalon transmission signal to render it insensitive to changes in the input optical power. In addition, the power reference signal may be used to monitor and control the power of the laser.

Figure 2:
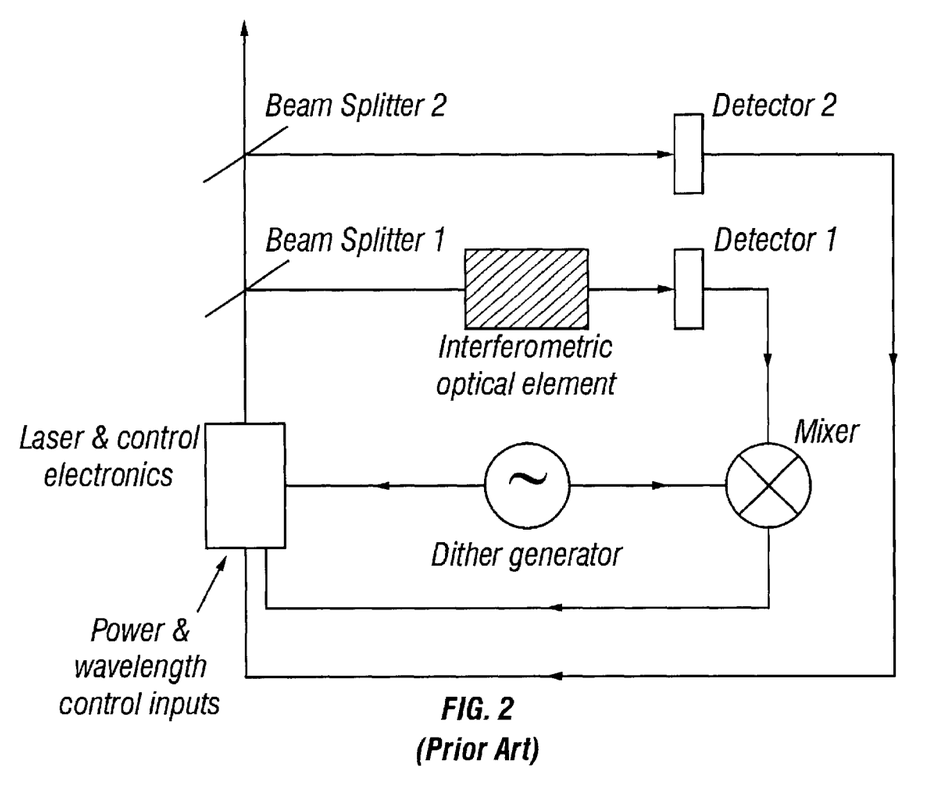
FIG. 2 is an illustration of a prior art dither lock system.

An alternative method to lock the laser wavelength to a reference interferometric optical element is a so-called dither lock (see FIG. 2). The goal of a dither lock is to quantify how the etalon responds to a time-varying wavelength, and then to use this information to control the time-averaged value of the laser wavelength (or, in even broader sense, some statistical moment of the wavelength distribution in time, of which the average is just one example). This is accomplished by comparing the known variations in the laser wavelength to the variations in the signal of the light that has interacted with the etalon. Thus the comparator receives two signals: one from the dither generator that represents how the wavelength is varying in time, and a second from the detector that represents the reaction of the light upon interacting with the etalon.

Using a mixer, phase sensitive detector, a multiplier, or other comparator, the response of the etalon to a laser beam with time-varying wavelength can be quantified. This "wavelength responsivity" is the output of the comparator. The circuit then compares the measured wavelength responsivity to a desired responsivity, and adjusts the laser to maintain a lock on the desired responsivity.

As an example, one typical wavelength responsivity of interest is the first derivative of the etalon response with respect to changes in wavelength. To measure the first derivative, a sinusoidal oscillator generates the wavelength dither. With proper phase adjustment, the output of the comparator is the first derivative of the etalon response. The first derivative is equal to zero at the peak of the etalon transmission function, which makes an excellent lock point for a dither lock system. With this type of sinusoidal dither and detection, the average value of the laser output wavelength is locked to the point of maximum transmission of the etalon.

Because a wavelength locker is a calibrated reference, its design must be insensitive to changes in the operating environment. The primary environmental concerns are temperature changes and polarization sensitivity of the beam splitters. Temperature changes to the etalon cause changes in the optical path length of the interferometric optical element (due to the material's thermal coefficient of expansion and/or temperature-dependent refractive index), thereby changing the FSR and peak locations of the FP etalon and causing the laser to detune from the desired lock frequency. Thermally-induced changes to the etalon may be mitigated by constructing the etalon from temperature-insensitive materials, applying direct temperature control to the wavelength locker, or both.

Polarization sensitivity of the beamsplitters in the wavelength locker will change the power normalization signal, which shifts the lock signal and causes the laser to detune in frequency. There are several strategies to minimize polarization sensitivity. One approach is to use the free-space propagating beam in a laser module such that the state of polarization (SOP) is known. Thus, the coatings on optics and beamsplitters can be optimized for the SOP. Nonetheless, due to manufacturing tolerances and variable operating conditions, some mismatch between coatings and SOP may persist. A second approach is to make the coatings polarization dependent, but identical for both the etalon and power reference optical paths. An example is an identical coating to the reflective surfaces in a monolithically fabricated dual beam splitter. In this case, any shift in the polarization state results in the same change in reflectivity at both interfaces, and the reflectivity changes are common mode to the two measurement paths. The monolithic fabrication of a dual beamsplitter also ensures the angle of incidence is identical for each beamsplitter, which further minimizes differences in reflectivity due to the SOP. Finally, a third approach to polarization sensitivity is to choose coatings of the beam splitter that are altogether non-polarizing.

In addition to the basic technical requirements of a wavelength locker, the optical networking market requires that wavelength lockers possess a small size, exhibit a long lifetime and are inexpensive. Physical size constraints are strict because most communication lasers fit into industry-standard 14-pin "butterfly" packages and many laser vendors require that the wavelength locker be internal to their laser package. Typical volume constraints for a wavelength locker are on the order of 30 mm³. In order to fit in such a confined space tight manufacturing tolerances and monolithic architectures are necessary.

The long lifetimes of telecommunications systems demand that wavelength lockers operate robustly over a very long periods (>20 years). Wavelength lockers must be constructed to avoid the outgassing of superfluous material, to survive mechanical and thermal shock, and otherwise not to age in any observable or detrimental way. Epoxies and adhesives in the beam path are notorious for age-dependent power losses, outgassing, and inadvertent etalon effects and must be eliminated from a design.

Finally, the large number of lasers needed for a communication system requires that the wavelength locker for each laser is inexpensive to manufacture in high volumes.

There is a need for a wavelength locker that has a small physical size. There is also a need for a wavelength locker with a size suitable for placement inside an associated laser package. There is a further need for a wavelength locker that operates robustly over very long lifetimes. Yet another need is for a wavelength locker that does not use epoxies and adhesives in the beam paths.

SUMMARY

Accordingly, an object of the present invention is to provide a wavelength locker that has a small physical size.

Another embodiment of the present invention is to provide a wavelength locker with a size that is suitable for placement inside to an associated laser package.

A further object of the present invention is to provide a wavelength locker that operates robustly over very long lifetimes.

Yet another object of the present invention is to provide a wavelength locker that does not use epoxies and adhesives in beam paths.

A further object of the present invention is to provide a power reference signal for monitoring optical power and using said signal for the control of the output optical power of the laser.

Another object of the present invention is to provide a wavelength locker that improves the information-carrying capacity of an optical networking system.

A further object of the present invention is to provide a wavelength-locking apparatus that is highly configurable, easily manufactured, low-cost and very robust.

These and other objects of the present invention are achieved in a wavelength locker that includes a first beam splitter positioned in a beam path of an output beam produced by a laser. The first beam splitter splits the output beam into a first beam and a second beam. An interferometric optical element is optically contacted to the first beam splitter. The interferometric optical element receives the second beam from the first beam splitter and generates a third beam with an optical power that varies periodically with wavelength. A second beam splitter is positioned in a beam path of the first beam and creates a fourth beam. A first detector generates a first signal in proportion to an optical power of the third beam. A second detector generates a second signal in proportion to an optical power of the fourth beam. A wavelength of the output beam is adjusted in response to a comparison of the first and second signals and a predetermined reference signal level.

In another embodiment of the present invention, a wavelength locker has a dither generator coupled to and interacting with a laser to produce an output beam with a wavelength that varies in time. The dither generator produces a first signal that is representative of variation of the wavelength in time. A beam splitter is positioned in a beam path of the output beam and splits the output beam into a first beam and a second beam. A interferometric optical element is optically contacted to the beam splitter. The interferometric optical element interacts with the second beam to produce a third beam. A first detector is positioned to receive the third beam and produce a second signal that represents the reaction of the second beam with the interferometric optical element. A comparator is coupled to the first detector and the dither generator. The comparator is configured to receive the first signal at a first input, the second signal at the second input and produce an output that is proportional to a product of the first and second signals. The comparator compares the output to a reference and generates an error signal that is applied to the laser in order to drive a wavelength error to zero.

DETAILED DESCRIPTION OF THE PREFERRED EMBODIMENTS

Figure 3A:
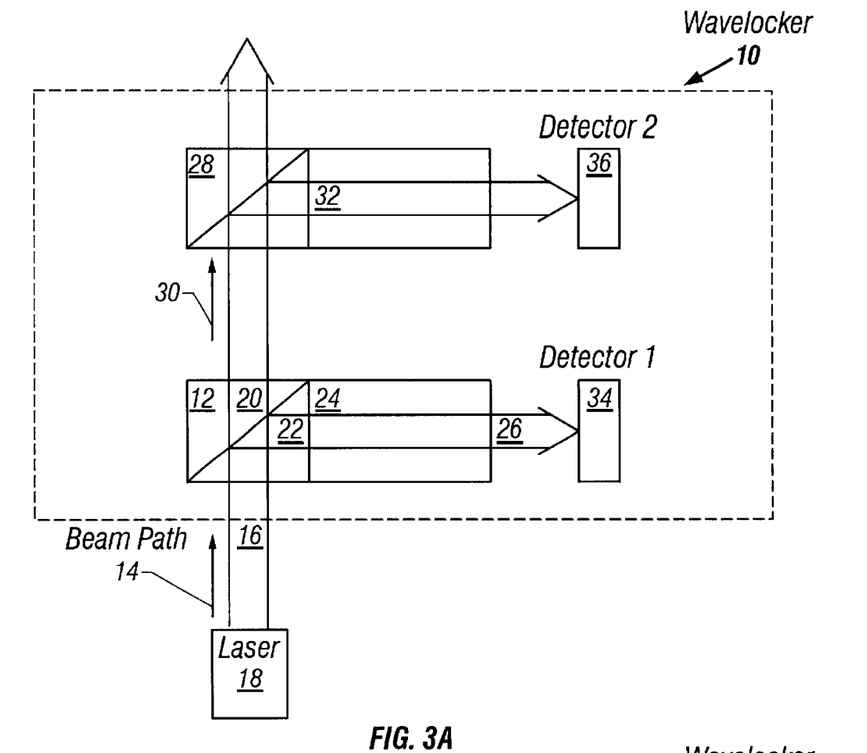
FIG. 3(a) is a schematic diagram illustrating one embodiment of a wavelength locker of the present invention with a beam splitter optically contacted to an interferometric optical element.

Referring now to FIG. 3(a), one embodiment of a wavelength locker 10 of the present invention includes a first beam splitter 12 positioned in a beam path 14 of an output beam 16 produced by a laser 18. First beam splitter 12 splits output beam 16 into a first beam 20 and a second beam 22. An interferometric optical element 24 is optically contacted to first beam splitter 12. Interferometric optical element 24 receives second beam 22 from first beam splitter 12 and generates a third beam 26 with an optical power that varies periodically with wavelength. A first detector 34 generates a first signal in proportion to an optical power of third beam 26.

A second beam splitter 28 is positioned in a beam path 30 of first beam 20 and creates a fourth beam 32. A second detector 36 generates a second signal in proportion to an optical power of fourth beam 32. A wavelength of output beam 16 is adjusted in response to a comparison of the first and second signals and a predetermined reference signal level.

Figure 3B:
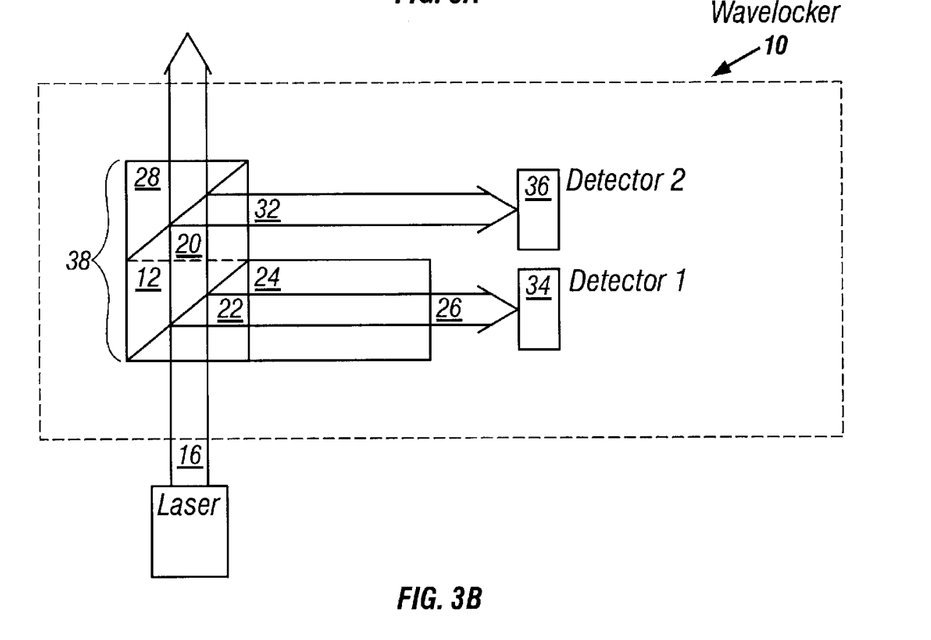
FIG. 3(b) illustrates is a schematic diagram of one embodiment of a wavelength locker of the present invention with a monolithic dual beam splitter optically contacted to an interferometric optical element.

In an alternate embodiment of FIG. 3(b), first and second beam splitters 12 and 28 can be integrated as a single dual beam splitter 38. Beam splitters 12 and 28 can have a low reflectance of output beam 16. In one embodiment, first beam 22 is 0.1 to 5.0% of output beam 16. At least one face of beam splitters 12 and 28 can have a wedged shaped geometry. The use of a wedged-shaped geometry is significant for measuring the beam reflected off interferometric optical element 24.

Interferometric optical element 24 has a modest finesse, and can be in the range of finesse=0.1–10. In one embodiment, interferometric optical element 24 is an etalon that can be solid or include an air gap positioned between its front and back surfaces. In this configuration, the reflectivities of the etalon surfaces are moderate, including but not limited to the range of 10–90%. Interferometric optical element 24 is configured to have a FSR that is equal to the desired channel spacing, which is typically the ITU channel. When the FSR matches the channel spacing, laser 18 can be locked to the same point on an etalon fringe at every channel. The FSR is matched to the ITU grid through a combination of precise manufacturing tolerances, angular alignment of wavelength locker 10, and/or temperature tuning.

Figure 4A:
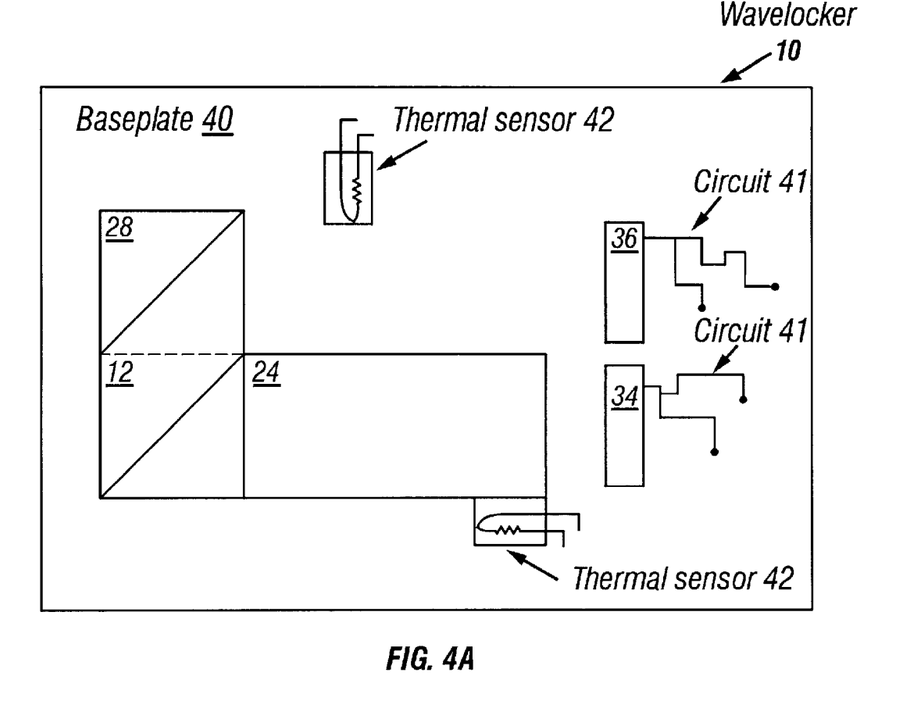
FIG. 4(a) is a schematic diagram of one embodiment of a wavelength locker of the present invention assembled on a base plate with a thermal monitor.

In another embodiment shown in FIG. 4(a), wavelength locker 10 can also include a base plate 40 that mounts first and second beam splitters 12 and 28, interferometric optical element 24 and first and second detectors 34 and 36. Base plate 40 can be sized to fit the elements mounted on it and can have a size of a few square millimeters or less. Base plate 40 can have a circuit 41 printed on it to make electrical connections to separate electrical circuits. Additionally, circuit 41 can be configured to alternate a polarity of a transmission signal of interferometric optical element 24 at alternating channels. This can be achieved by coupling circuitry 41 to a laser feedback control servo system.

A thermal sensor 42 can also be mounted to base plate 40 or directly to interferometric optical element 24. Suitable thermal sensors 42 include but are not limited to thermistors, thermocouples and thermally sensitive transistor circuits. In one embodiment, thermal sensor 42 is integrated into interferometric optical element 42 to directly measure the temperature. An example of such a device is a silicon etalon on which a thermistor or thermally sensitive circuit is printed.

Figure 4B:
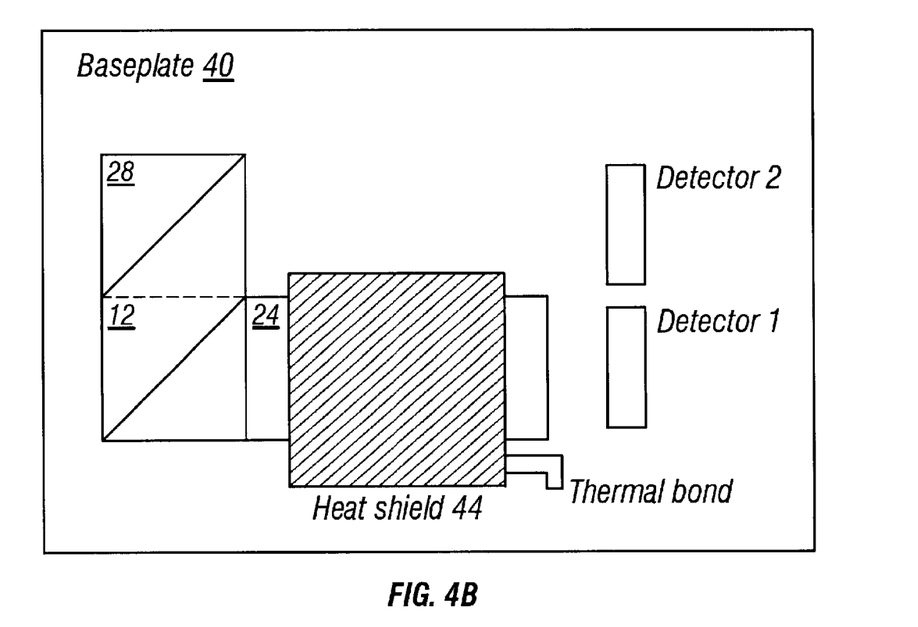
FIG. 4(b) is a schematic diagram of of the FIG. 4(a) wavelength locker with a heat shield.

Referring to FIG. 4(b), a heat shield 44 is optionally mounted over interferometric optical element 24 and thermally coupled to base plate 40. Heat shield 44 can be made of a material with a thermal conductivity higher than the material of interferometric optical element 24. Examples of heat shield 44 materials include but are not limited to ceramics, such as alumina, aluminum nitride, or beryllia, or metals such as copper, Kovar, beryllium copper, copper tungsten, and the like.

Beam splitters 12, 28 and 38 and interferometric optical element 24 can be made of a variety of materials. In one embodiment, interferometric optical element 24 is made of a high index material to minimize the required space for a given FSR. Suitable high index materials include but are not limited to glasses, such as Schott LaSFN9 and the like, and semiconductor materials such as silicon, gallium arsenide, indium phosphide, and the like.

Beam splitters 12 and 28 can be constructed of a material that has the same thermal expansion coefficient as the material of interferometric optical element 24 in order to minimize stresses during thermal cycling. Alternatively, beam splitters 12 and 28 can be made of Pyrex glass and interferometric optical element 24 made from silicon.

Figure 5:
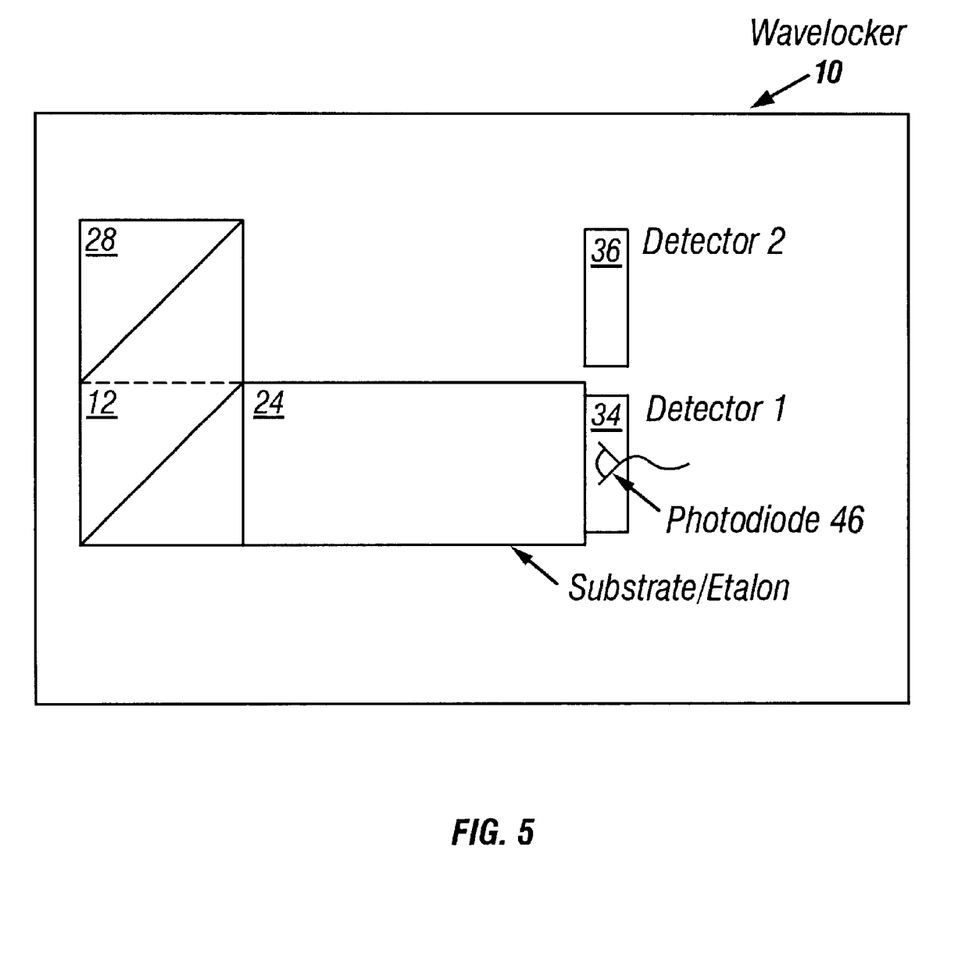
FIG. 5 illustrates a schematic diagram of one embodiment of the present invention that has detector substrate as part of an interferometric optical element.

In one embodiment, shown in FIG. 5, first detector 34 includes a substrate, and interferometric optical element 24 is a part of that substrate. In this embodiment, the substrate forms all or part of interferometric optical element 24, such as an etalon, and first detector 34 is illuminated by light passing through the substrate, in a so-called "back-illuminated" configuration. The substrate of first detector 34 can be made of a semiconductor material, such as indium phosphide, silicon, gallium arsenide, and the like. First detector 34 can be a photodiode 46 grown on the substrate. Suitable photodiodes can be constructed of indium gallium arsenide, germanium, silicon germanium, and the like.

Figure 6:
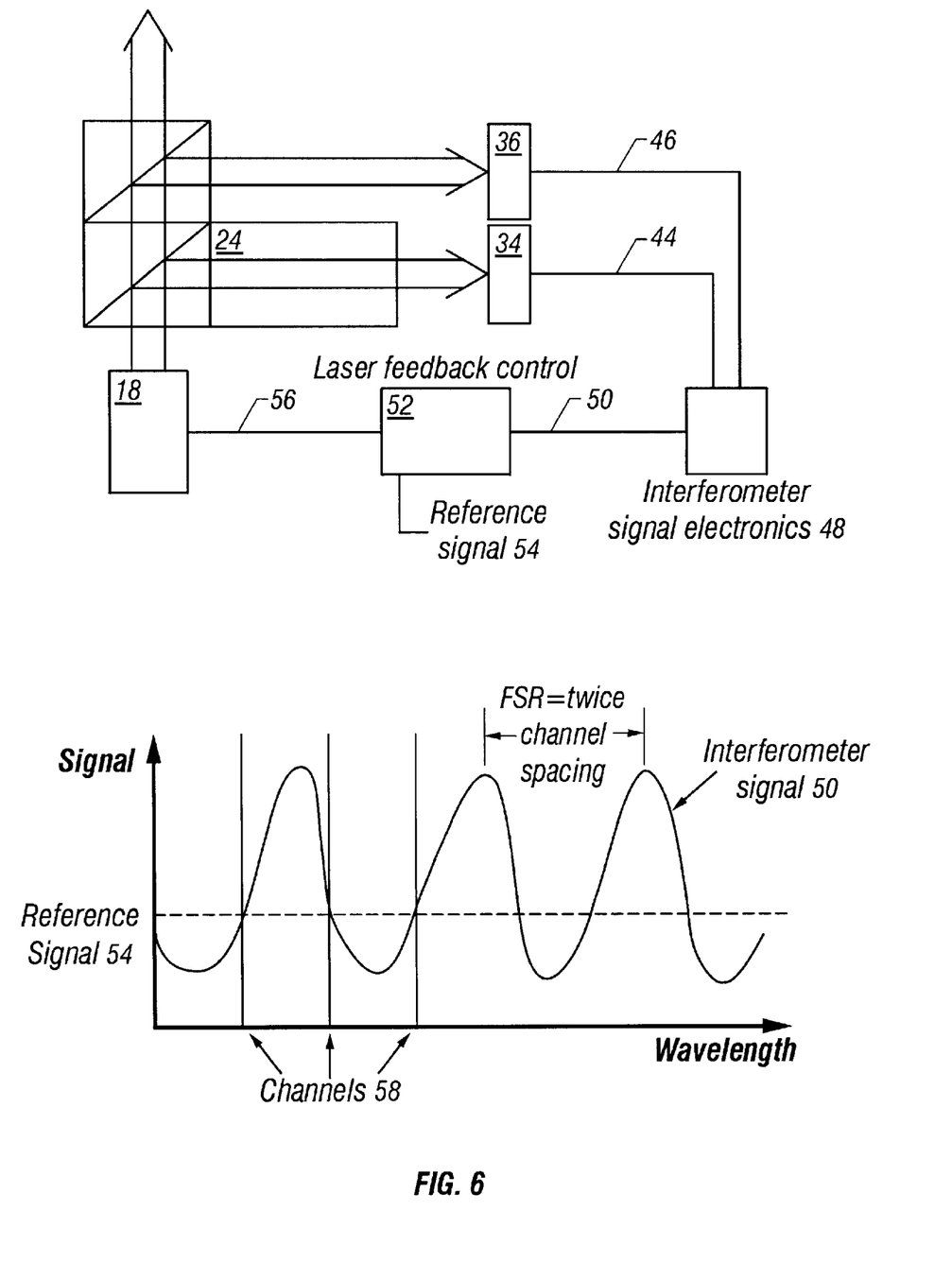
FIG. 6 illustrates the location of lock points on both sides of the etalon fringes.

In another embodiment, interferometric optical element 24 is constructed with a FSR that is twice the channel spacing. In this embodiment, seen in FIG. 6, laser 18 is locked to alternating sides of interference fringes. First and second photodetectors 34 and 36 generate signals 44 and 46 that are coupled to interferometer signal electronics 48. The interferometer signal electronics generate interferometer signal 50 that is in proportion to the transmission through interferometric element 24. Interferometer signal 50 couples to a laser feedback control servo system 52 that compares interferometer signal 50 with a reference signal level 54 to generate an error signal 56. The polarity of the error signal 56 alternates with each channel 58 in order to provide stable locking to successive ITU channel grid points. Error signal 56 couples to laser 18 and adjusts the wavelength of laser 18 until interferometer signal 50 matches the reference signal 54.

Figure 7:
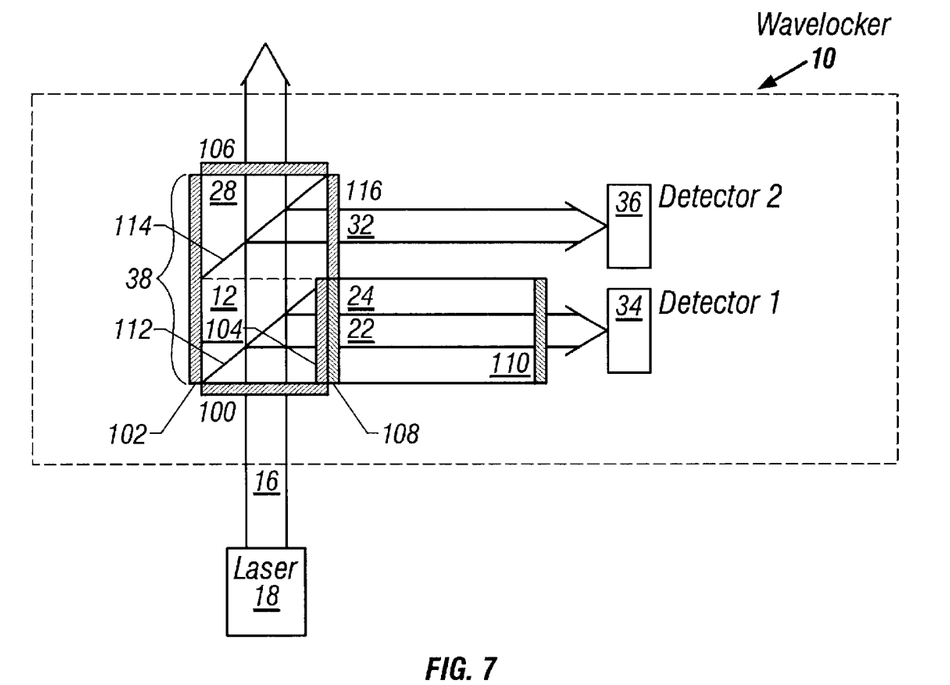
FIG. 7 illustrates the location of coatings on the beamsplitter and etalon faces of one embodiment of the wavelength locker of the present invention.

A variety of different coatings, in one or more layers, can be applied to one or more surfaces of beam splitters 12, 28 and 38 and interferometric optical element 24 (FIG. 7). Suitable coatings 112 and 114 applied to beam splitters 12, 28 and 38 include but are not limited to a single layer of tantalum pentoxide with a thickness of 0.29 waves, measured at normal incidence. The coatings 112 and 114 may be substantially non-polarizing so as to eliminate polarization dependent differences between the power in optical beams 22 and 32. Alternatively, coatings 112 and 114 may be polarization dependent, but substantially identical at reflective surfaces in beam splitters 12, 28 and 38 so that the changes in the optical powers of beams 22 and 32 are substantially identical. Suitable coatings 108 and 110 applied to the interferometric optical element 24 include but are not limited to multi-layer coatings involving tantalum pentoxide, silicon dioxide, silicon nitride, silicon, and titanium oxide. Anti-reflection (AR) coatings 100, 102, 104, 106 and 116 can be applied to the input and output surfaces of beam splitters 12, 28 and 38 and interferometric optical element 24. The AR coatings may be applied to minimize stray reflections, minimize insertion loss, and prevent unwanted interferences.

Figure 8A:
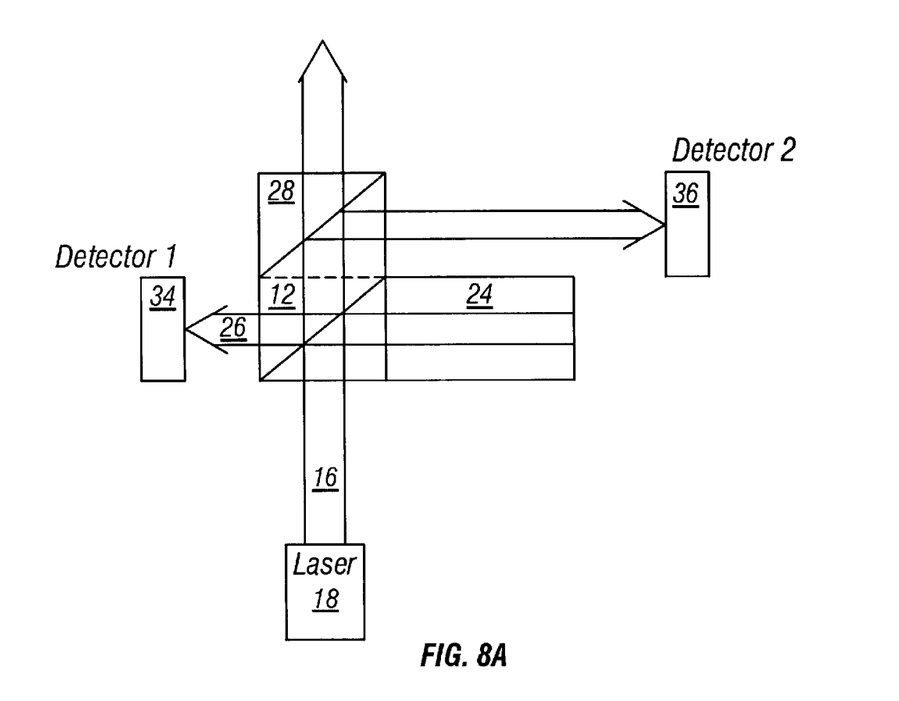
FIG. 8(a) illustrates, in one embodiment of the present invention, how light reflected off of an etalon is detected through a beam splitter.
Figure 8B:
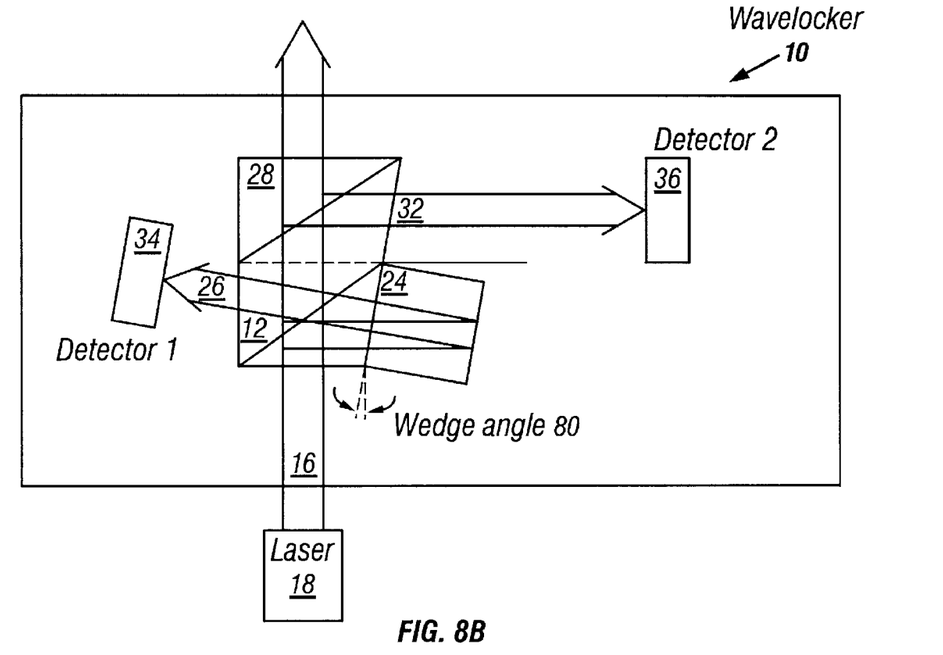
FIGS. 8(b) and 8(c) illustrate different embodiments of etalons used with different wavelength lockers of the present invention, where the etalons have wedged geometries at the etalon contact surface that do not form a 90 degree angle relative to an output facet of a beam splitter.
Figure 8C:
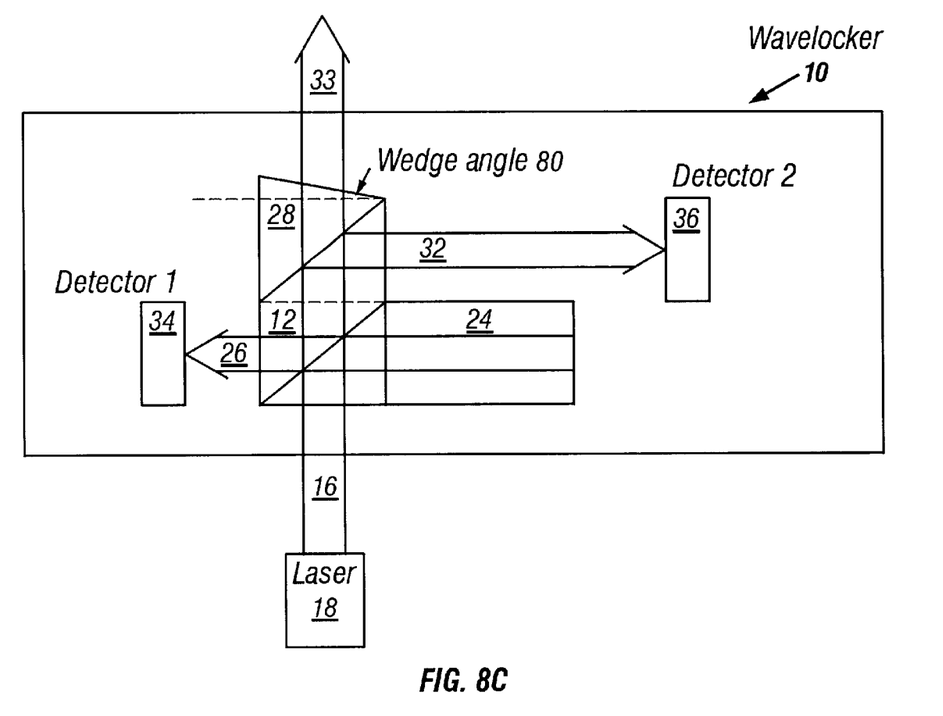

In another embodiment shown in FIG. 8(a), third beam 26, which varies in power with wavelength, is a beam reflected off of interferometric optical element 24 and passes back through first beam splitter 12 to first detector 34. In related embodiments, a wedged geometry is preferred to prevent undesirable interferences. In FIG. 8(b), a preferred geometry uses a wedge angle 80 on the surface of beam splitter 12 that interfaces with interferometric optical element 24, and the surface of beam splitter 28 that transmits optical beam 32 to second detector 36. Alternatively, FIG. 8(c) shows a preferred geometry using a wedge angle 80 on the surface of beam splitter 28 that transmits the throughput optical beam 33. Yet another embodiment combines the wedged configurations of FIGS. 8b and 8c in a single device in which the wedge angles are substantially different. An advantage of each embodiment shown in FIG. 8 is that the wavelength locker 10 occupies a smaller lateral extent than in the case of detecting the beam transmitted through interferometric optical element 24.

Figure 9:
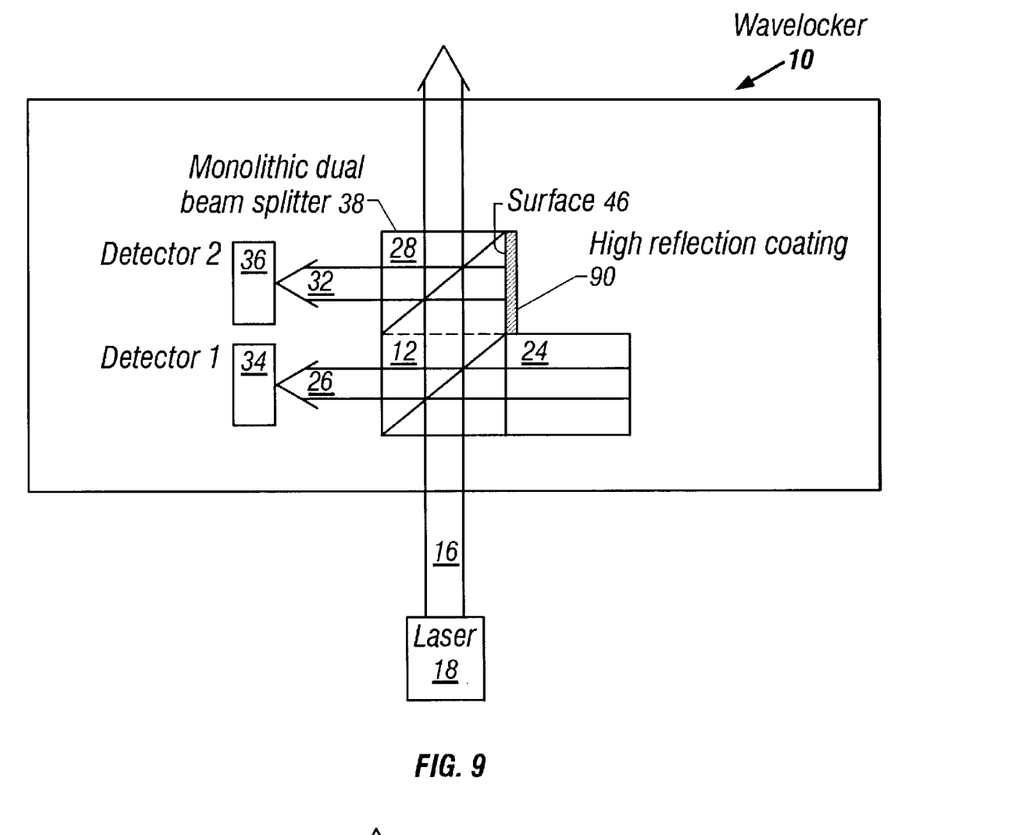
FIG. 9 illustrates an embodiment of the present invention where both the power reference beam and the beam reflected off the etalon pass back through beam splitters to detectors.

In another embodiment (FIG. 9), first and second detectors 34 and 36 are mounted in a manner to detect beams in a reflection geometry. A high reflection coating 90 is applied to the face 46 of second beam splitter 28, thereby generating an optical beam 32 that serves as a power reference and is detected by detector 36. One advantage of this geometry is that if first and second beams 26 and 32 are precision spaced apart, on the same side of beam splitters 12, 28 (or 38), then the optical beams can be matched to precision-spaced detectors.

Figure 10:
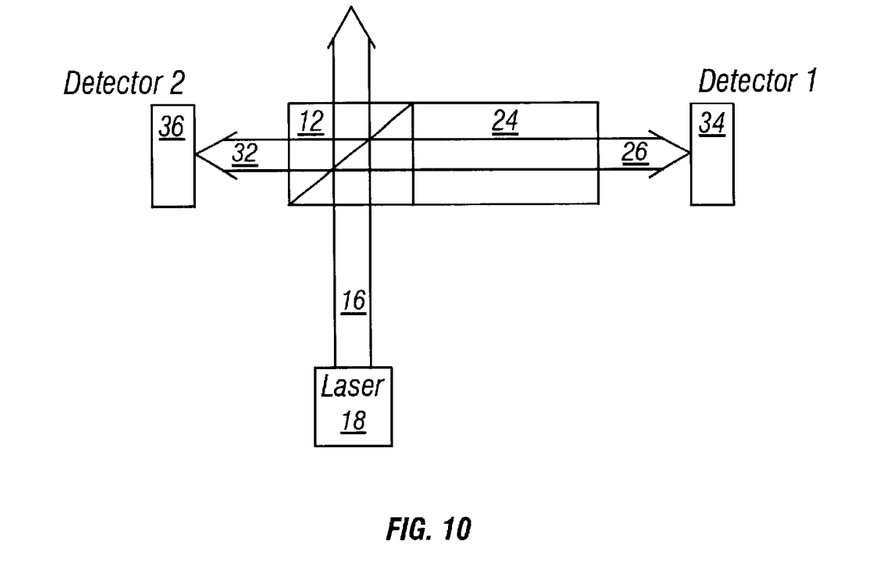
FIG. 10 illustrates an embodiment of the present invention where a single beam splitter is contacted to an etalon, and both the transmitted light and the reflected light from the etalon are detected.

Another embodiment of reflection geometry is FIG. 10. The transmission through interferometric optical element 24 is detected by first detector 34, and the reflection back through the first beam splitter 12 can be detected on second detector 36. A signal that depends only on the wavelength of optical beam 14 may be generated by taking the difference of the two signals generated by detector 34 and 36, divided by the sum of signals from detectors 34 and 36. A signal that is proportional to the power of optical beam 14 may be generated by taking the sum of the signals from detectors 34 and 36.

Figure 11:
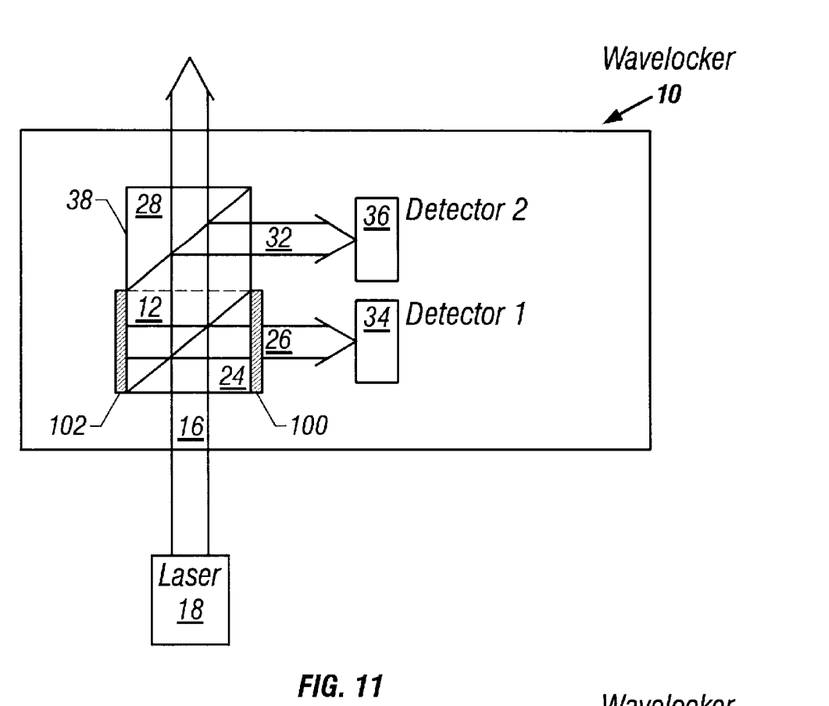
FIG. 11 illustrates an embodiment of the present invention where the partially reflecting surfaces of an etalon are identical with two faces of a beam splitter cube.

Referring to FIG. 11, interferometric optical element 24 can be formed by applying partial reflection coatings 100 and 102 directly to the surfaces of beam splitter 12. This embodiment provides a very compact design that has a volume little larger than the cube of the clear aperture, which typically is a volume of approximately 5 mm$^3$. First and second detectors 34 and 36 can be placed on either side of the beam splitters 12 and 28.

Figure 12:
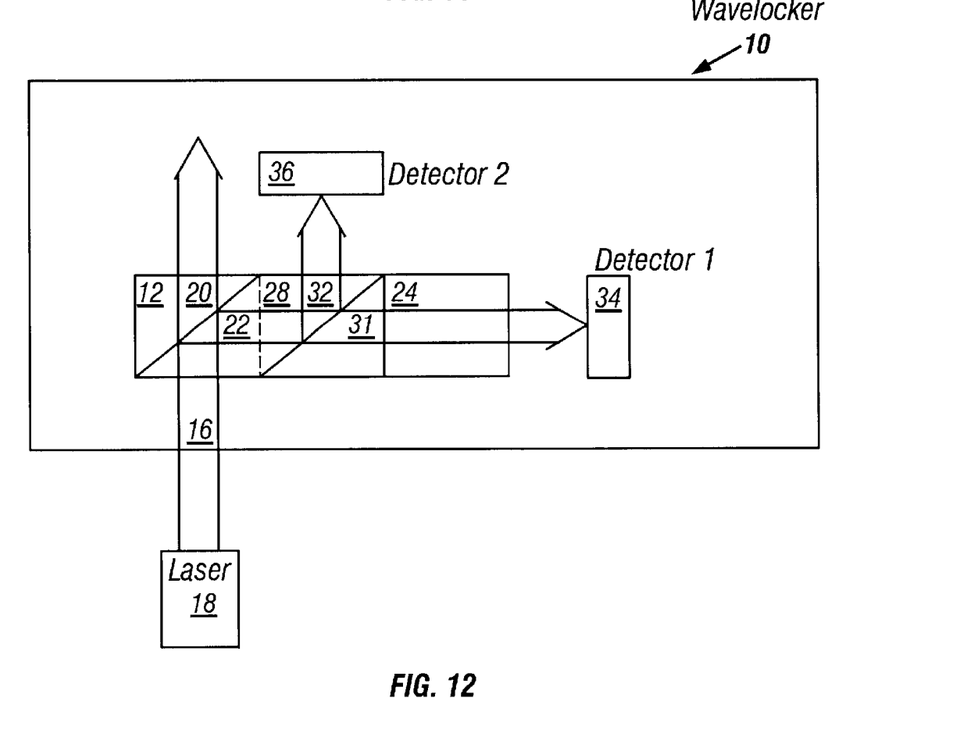
FIG. 12 illustrates an embodiment of the present invention with a first beam splitter that directs a beam towards a second beam splitter, which in turn directs one beam to a power reference and a second beam through an etalon that is optically contacted to the beam splitter and to a second detector.

In another embodiment shown in FIG. 12, first beam 16 can pass through only one of the first and second beam splitters 12 and 28. First beam splitter 12 generates output beam 20 and a first deflected beam 22. Second beam splitter 28 generates second transmitted beam 31 and a second deflected beam 32. Second transmitted beam 31 is then directed through interferometric optical element 24 to first detector 34. Second reflected beam 32 is directed towards second detector 36 to generate a power normalization signal.

Figure 13A:
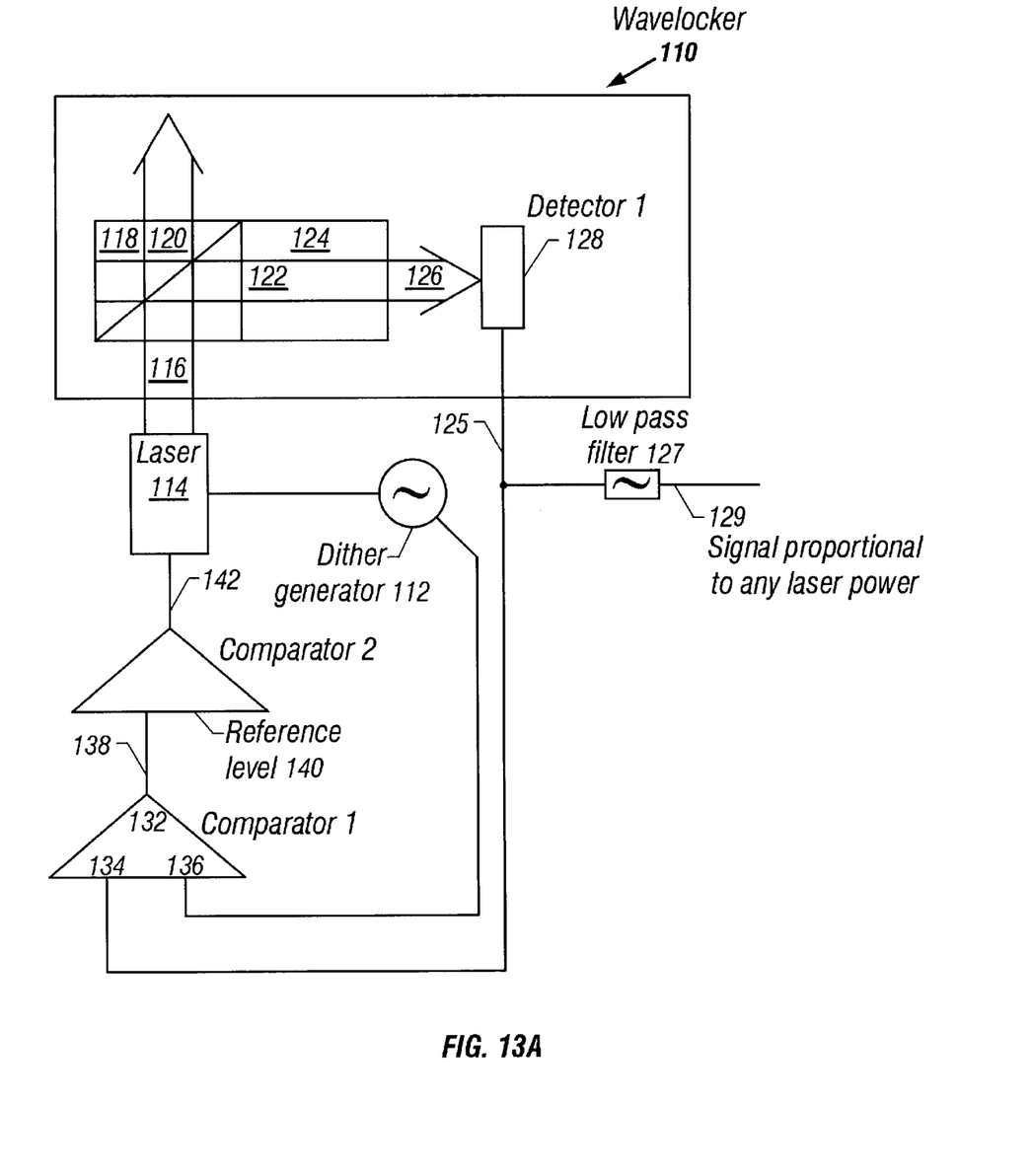
FIG. 13(a) illustrates one embodiment of the present invention that has a modified dither lock in which a single beam splitter, etalon, and single detector are used to generate both the frequency and power information, and the frequency is generated by mixing the optical signal with the dither signal and the power information is generated by low pass filtering of the optical signal.

Referring now to FIG. 13(a), the present invention can be a wavelength locker 110 with a dither generator 112 that couples to and interacts with a laser 114 in order to produce an output beam 116 with a wavelength that varies in time. Dither generator 112 produces a first signal that is representative of variation of the wavelength in time. A beam splitter 118 is positioned in a beam path of output beam 116 and splits output beam 116 into a first beam 120 and a second beam 122. Interferometric optical element 124 interacts with second beam 122 to produce a third beam 126. Element 124 may be optically contacted to beam splitter 118. The interferometric element 124 can be a Mach Zehnder interferometer, a Michelson interferometer, an etalon and the like.

A first detector 128 is positioned to receive third beam 126 and produce a second signal 125 that represents the reaction of second beam 122 with interferometric optical element 124. A portion of signal 125 is coupled to a low pass filter 127. Low pass filter 127 generates a signal 129 that is proportional to the average power of laser 114. A comparator 132 is further coupled to first detector 128 via signal 125, and to dither generator 112. Comparator 132 is configured to receive the first signal at a first input 134, the second signal at a second input 136 and produce an output 138 that is proportional to a product of the first and second signals. Comparator 132 generates an output 138 that is compared to a reference level 140 and generates an error signal 142 that is applied to laser 114 in order to drive a wavelength error to zero. It will be appreciated that the elements of wavelength locker 110 can be the same as those listed above for wavelength locker 10. Additionally, laser 114 can lock to a peak of transmission of interferometric optical element 124 in order to minimize the insertion loss.

A benefit of the dither locking embodiment of wavelength locker 110 is that, when the wavelength of laser 114 is stabilized by wavelength locker 110, the power of laser 114 can be accurately measured by the same photodetector 128 that detects the wavelength responsivity of interferometric optical element 124. Additionally, with wavelength locker 110, only one beam splitter and one photodiode are required.

Figure 13B:
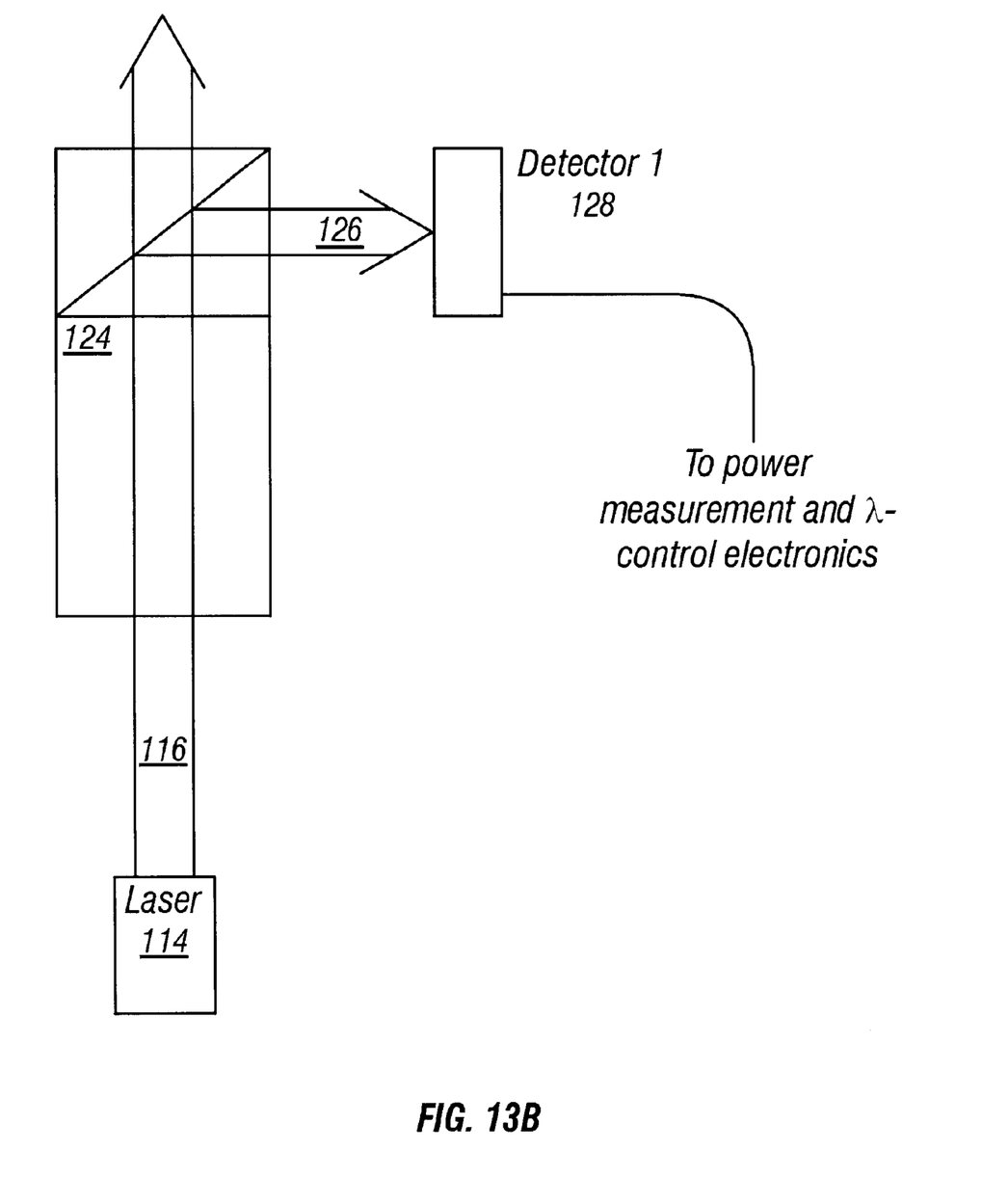
FIG. 13(b) illustrates an embodiment of the present invention that uses a single beam splitter, etalon, and single detector used with a dither lock.
Figure 13C:
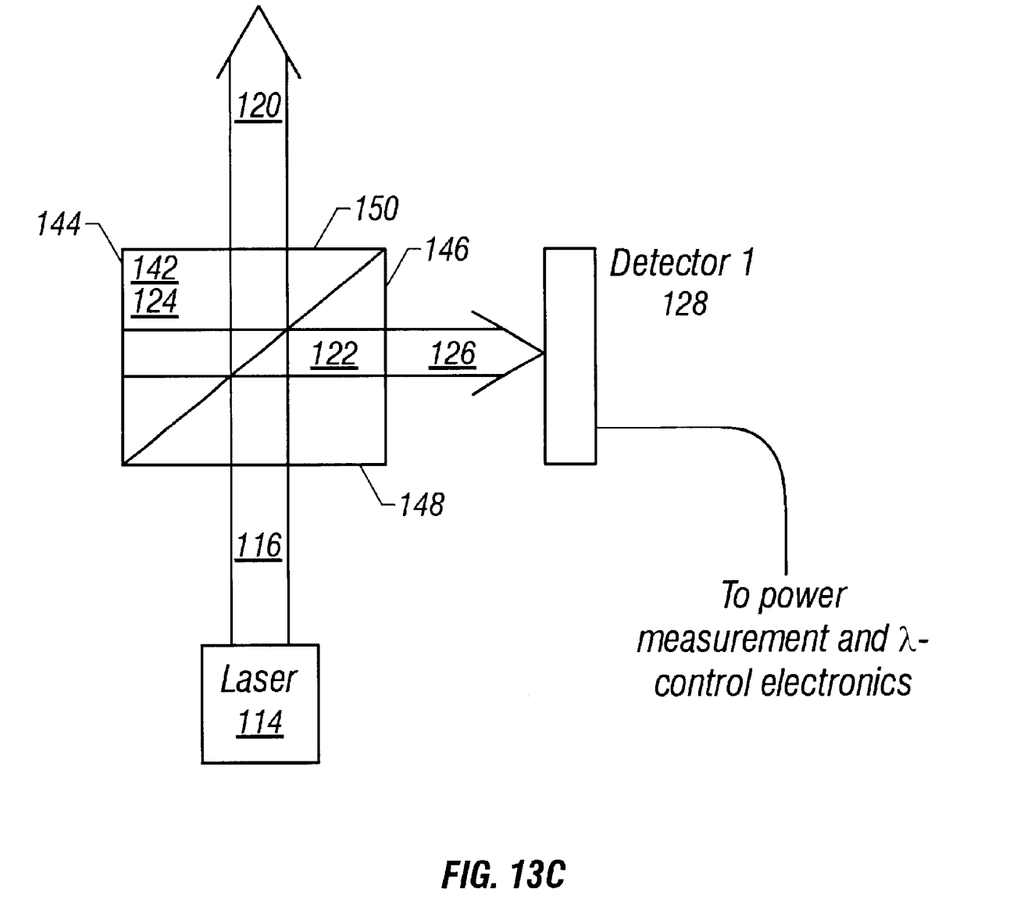
FIG. 13(c) illustrates another dither lock embodiment of the present invention where the etalon is formed from two surfaces of a single beam splitter.

Substantially similar wavelength dither and electronics can be used with other wavelocker embodiments. Referring to FIG. 13(b), Interferometric optical element 124 can be positioned in the beam path of output beam 116. In another embodiment shown in FIG. 13(c), interferometric optical element 124 can be formed by coating the sides of a single beam splitting cube 142. Beam splitter cube 142 intercepts the output beam 116 of laser 114 and produces a first optical beam 120 and a second optical beam 122. In one specific embodiment, surfaces 144 and 146 are substantially parallel to first optical beam 116 and form the interferometric optical element. In another specific embodiment, surfaces 148 and 150 substantially orthogonal to optical beam 116 can form the interferometric optical element. Detector 128 is preferably positioned to catch third optical beam 126. The size of this embodiment is limited only by the required clear aperture of the input laser beam and the spacing required for the FSR, and the volume can be as small as a few mm³.

In various embodiments, wavelength lockers 10 and 110 use optical contact for interferometric optical element 24 and interferometric optical element 124 to beam splitter 12 and beam splitter 118 which provides an extremely compact device. Additionally, the use of optical contacting eliminates at least one air gap which could result in a stray interference with resulting distortion of the interferometric optical element 24 or interferometric optical element 124 fringes. The optically-contacted, monolithic designs of wavelength lockers 10 and 110 increase functionality, reduce size, eliminate potential outgassing due to the use of adhesives, and reduce alignment sensitivities.

Monolithic fabrication of beam splitters 12 and 28, which can be a dual beam splitter 38, ensures that the two reflecting surfaces are substantially parallel. This results in identical incidence angles for the main beam to the reflecting surfaces. Identical incidence angles, combined with identical coatings, ensure identical reflectivity at both reflecting surfaces of the beam splitter. Precision spacing of the two beams reflected by a dual beam splitter 38 can be matched to a precision spacing of detectors 34 and 36, thereby minimizing the effects of errors in alignment to the detectors. Precision spacing of detectors 34 and 36 can be achieved through monolithic fabrication on a common substrate, such as fabrication through photolithography. Additionally, the monolithic fabrication used with the present invention is particularly well suited for wafer-based fabrication techniques Beam splitters 12 and 28 or 38 can be fabricated and put together in various geometries in order to provide the best configuration for a any given space constraint.

The low reflectance of beam splitters 12 and 28 or 38 makes it possible to sample the reflected beam as well as the transmitted beam. Additionally, in certain embodiments of the present invention, the geometries used in wavelength lockers 10 and 110 provide that light impinges on interferometric optical element 24 and interferometric optical element 124 at or near normal incidence. This reduces the sensitivity on angle alignment into wavelength lockers 10 and 110.

Wavelength lockers 10 and 110 provide solutions to many of the current problems posed by the increasing demands of the optical networking industry. Wavelength lockers 10 and 110 can be integrated into a telecom laser package and operated over any communication band with channels located on a regular frequency interval, such as the ITU grid, and maintain a frequency lock tolerance of <1.5 GHz. Further, wavelength lockers 10 and 110 are rugged enough to pass Telcordia requirements, compact enough to be included inside an industry-standard 14-pin laser package with minimal insertion loss, and are cost efficient enough to allow mass marketing of the integrated systems.

The foregoing description of a preferred embodiment of the invention is presented for purposes of illustration and description. It is not intended to be exhaustive or to limit the invention to the precise forms disclosed. Obviously, many modifications and variations will be apparent to practitioners skilled in this art. It is intended that the scope of the invention be defined by the following claims and their equivalents.

What is claimed is:

1. A wavelength locker for controlling the wavelength and measuring the optical power of a first beam, comprising:
   a first beam splitter positioned in a beam path of an output beam produced by a laser, the first beam splitter splitting the output beam into a first beam and a second beam;
   an interferometric optical element optically contacted to the first beam splitter, the interferometric optical element receiving the second beam from the first beam splitter to generate a third beam with a total optical power that varies periodically with wavelength;
   a first detector that generates a first signal in proportion to an optical power of the third beam; and
   a means to generate a second signal from which the optical power of the first beam can be derived; and
   wherein a wavelength of the output beam is measured by comparison of the first and second signals, and a wavelength of the output beam is adjusted in response to the comparison of the first and second signals and a predetermined reference signal level.

2. The wavelength locker of claim 1, wherein the interferometric optical element is an etalon.

3. The wavelength locker of claim 1, wherein the third beam is a beam transmitted through the interferometric optical element.

4. The wavelength locker of claim 1, wherein the third beam is reflected off the interferometric optical element and passes back through the first beam splitter.

5. The wavelength locker of claim 1, in which at least a portion of the first beam splitter is positioned in an interior of the interferometric optical element.

6. The wavelength locker of claim 1, wherein the means to generate the second signal comprises a second beam splitter positioned in a beam path of an output beam produced by a laser, the second beam splitter creating a fourth beam, and a second detector positioned to receive a portion of the fourth beam and generate a second signal.

7. The wavelength locker of claim 1, wherein the interferometric optical element generates a third transmitted beam and a fourth reflected beam, a second detector receives a portion of the fourth beam and generates a second signal in proportion to the optical power of the fourth beam.

8. The wavelength locker of claim 1, wherein a second detector is configured to receive a portion of an output beam of a laser and generates a second signal in proportion to the optical power of said output beam of the laser.

9. The wavelength locker of claim 6, further comprising:
a base plate that mounts the interferometric optical element and first and second beam splitters.

10. The wavelength locker of claim 9, further comprising:
a base plate that mounts the interferometric optical element, first and second beam splitters and first and second detectors.

11. The wavelength locker of claim 10, further comprising:
a thermal sensor mounted to the base plate.

12. The wavelength locker of claim 11, further comprising:
a heat shield, mounted over the interferometric optical element and thermally coupled to the base plate.

13. The wavelength locker of claim 2, wherein optical contacting the etalon to the first beam splitter reduces stray reflections between the first beam splitter and the front face of the etalon.

14. The wavelength locker of claim 2, wherein the etalon is made of a high index material.

15. The wavelength locker of claim 14, wherein the high index material is selected from glass and a semiconductor material.

16. The wavelength locker of claim 14, wherein the high index material is silicon.

17. The wavelength locker of claim 2, wherein the first detector includes a substrate and at least a portion of the substrate is the etalon.

18. The wavelength locker of claim 17, further comprising:
a photodiode coupled to the etalon.

19. The wavelength locker of claim 2, wherein the etalon has a partial reflectivity coating.

20. The wavelength locker of claim 2, wherein the etalon has a partial reflectivity in the range of 20–80%.

21. The wavelength locker of claim 2, further comprising:
a coating applied to the etalon.

22. The wavelength locker of claim 21, wherein the coating is a multi layer coating.

23. The wavelength locker of claim 21, wherein the coating is a multi layer coating that includes tantalum pentoxide/silicon dioxide/tantalum pentoxide.

24. The wavelength locker of claim 2, wherein the etalon is a solid etalon.

25. The wavelength locker of claim 6, wherein the etalon includes an air gap positioned between the front and back surfaces.

26. The wavelength locker of claim 2, further comprising:
circuitry configured to alternate a polarity of an etalon transmission signal at alternating channels.

27. The wavelength locker of claim 26, wherein the circuitry is coupled to a laser feedback control servo system, the circuitry altering a polarity of the etalon transmission signal at alternating channels prior to a laser feedback control servo system receiving the etalon transmission signal.

28. The wavelength locker of claim 27, wherein the reflectivity of the etalon faces is substantially equal to 26.8%.

29. The wavelength locker of claim 2, wherein the etalon is configured to have a FSR of twice the ITU channel spacing.

30. The wavelength locker of claim 1, wherein the first and/or second beam splitters is a cube beam splitter.

31. The wavelength locker of claim 30 wherein the cube beam splitter is composed of two right-angle prisms bonded along the hypoteneuse.

32. The wavelength locker of claim 31, wherein the prisms are optically contacted along the hypoteneuse.

33. The wavelength locker of claim 1, wherein the first beam splitter has a low reflectance of the output beam into the second beam.

34. The wavelength locker of claim 1 wherein the first beam splitter has a low reflectance of the output beam into second beam in the range of 0.1 to 5.0%.

35. The wavelength locker of claim 31, wherein at least one of the hypoteneuse faces has a coating.

36. The wavelength locker of claim 35, wherein the coating is a single layer of tantalum pentoxide.

37. The wavelength locker of claim 35, wherein the coating is a single layer of tantalum pentoxide of ¼ wave thickness at 45 degrees angle of incidence.

38. The wavelength locker of claim 2, wherein at least one face of the first beam splitter has a wedged geometry.

39. The wavelength locker of claim 38, wherein the output face of the beam splitter forms an angle with the hypoteneuse that differs from 45 degrees.

40. The wavelength locker of claim 38, wherein the face of the beam splitter that is optically contacted to the etalon forms an angle with the hypoteneuse of the beamsplitter that differs from 45 degrees.

41. The wavelength locker of claim 2, further comprising:
an antireflection coating applied to the first and/or second beam splitters.

42. The wavelength locker of claim 2, further comprising:
an AR coating on a surface of the etalon that is optically contacted to the first beam splitter.

43. The wavelength locker of claim 6, wherein the first and second beam splitters are a monolithically fabricated dual beam splitter comprising two reflecting surfaces.

44. The wavelength locker of claim 43, wherein the reflecting surfaces have a coating.

45. The wavelength locker of claim 44, wherein the coatings on the reflecting surfaces are identical.

46. The wavelength locker of claim 43, wherein the dual beam splitter is composed of two right-angle prisms bonded to a rhomboidal prism.

47. The wavelength locker of claim 46, wherein the rhomboidal prism is constructed of a material with an index of refraction that differs from that of the right-angle prisms.

48. The wavelength locker of claim 43, wherein the dual beam splitter is fabricated with optical contacting.

49. The wavelength locker of claim 43, wherein the dual beam splitter has an anti-reflection coating.

50. A wavelength locker of claim 1, further comprising:
a dither generator configured to be coupled to and interact with a laser to produce an output beam with a wavelength that varies in time, the dither generator producing a first signal representative of variation of the wavelength in time;
a comparator coupled to the first detector and the dither generator, the comparator configured to receive the first signal at a first input, the second signal at the second input and produce an output that is proportional to a product of the first and second signals, the comparator comparing the output to a reference and generate an error signal that is applied to the laser to drive an error to zero.

51. The wavelength locker of claim 50, wherein the interferometric optical element is a Mach Zehnder interferometer.

52. The wavelength locker of claim 50, wherein the interferometric optical element is a Michelson interferometer.

53. The wavelength locker of claim 50, wherein the interferometric optical element is an etalon.

54. The wavelength locker of claim 50, wherein the beam splitter is a single beam splitter.

55. The wavelength locker of claim 50, wherein the beam splitter is a low reflectance beam splitter.

56. The wavelength locker of claim 50, wherein the beam splitter has a low reflectance of the output beam and the second beam is 0.1 to 5.0% of the output beam.

57. The wavelength locker of claim 53, wherein the etalon is positioned in the beam path.

58. The wavelength locker of claim 53, wherein the etalon is positioned off of the beam path.

59. The wavelength locker of claim 50, wherein the first detector is a partially absorbing detector.

60. The wavelength locker of claim 50, wherein the dither generator is an oscillator that varies the output beam periodically in time.

* * * * *